US011141820B2

(12) United States Patent
Chan et al.

(10) Patent No.: US 11,141,820 B2
(45) Date of Patent: Oct. 12, 2021

(54) SYSTEMS, APPARATUS AND METHODS FOR FORMING METAL STRIPS INTO DIES

(71) Applicant: Ontario Die International Inc., Kitchener (CA)

(72) Inventors: Tin To Chan, Kitchener (CA); Petr Piro, Kitchener (CA); Nir Rikovitch, Kitchener (CA); Jordan Lloyd, Kitchener (CA); Robert Amirault, Kitchener (CA)

(73) Assignee: Ontario Die International Inc., Kitchener (CA)

(*) Notice: Subject to any disclaimer, the term of this patent is extended or adjusted under 35 U.S.C. 154(b) by 0 days.

(21) Appl. No.: 16/554,141

(22) Filed: Aug. 28, 2019

(65) Prior Publication Data
US 2020/0086435 A1 Mar. 19, 2020

Related U.S. Application Data

(60) Provisional application No. 62/723,783, filed on Aug. 28, 2018.

(51) Int. Cl.
*B21D 37/10* (2006.01)
*B23P 15/24* (2006.01)
(Continued)

(52) U.S. Cl.
CPC ............ *B23P 15/24* (2013.01); *B21D 5/0209* (2013.01); *B21D 37/10* (2013.01); *B22D 17/22* (2013.01); *B23Q 3/15573* (2013.01)

(58) Field of Classification Search
CPC ...... B21D 5/004; B21D 5/008; B21D 5/0209; B21D 5/0254; B21D 28/02; B21D 35/001;
(Continued)

(56) References Cited

U.S. PATENT DOCUMENTS 4,773,284 A * 9/1988 Archer ................ B21D 7/12
76/4
5,335,529 A * 8/1994 Crowdus ............. B21D 7/02
29/464
(Continued)

FOREIGN PATENT DOCUMENTS

EP 2532456 B1 12/2012

OTHER PUBLICATIONS

International Search Report and Written Opinion dated Oct. 25, 2019 in corresponding International Patent Application No. PCT/CA2019/051191 (10 pages).

*Primary Examiner* — Edward T Tolan
(74) *Attorney, Agent, or Firm* — Bereskin & Parr LLP (57) ABSTRACT

A system for forming a metal strip into a die having a predetermined shape through a series of forming operations is described herein. The system includes a base configured to support the metal strip as the metal strip undergoes the series of forming operations; a feeding device configured to advance the metal strip between each forming operation of the series of forming operations and grip the metal strip during each forming operation; a bending device configured to bend a portion of the metal strip extending from the feeding device as one of the series of forming operations; a forming head configured to house a pair of forming tools and provide features to the portion of the metal strip extending from the feeding device as one of the series of forming operations using the one or more forming tools; a robotic arm configured to selectively provide the one or more forming tools to the forming head; and a computing unit in communication with the robotic arm and configured to transmit a control signal to cause the robotic arm to retrieve the pair of forming tools and provide the pair of forming tools to the forming head.

15 Claims, 6 Drawing Sheets

(51) Int. Cl.
*B22D 17/22* (2006.01)
*B21D 5/02* (2006.01)
*B23Q 3/155* (2006.01)

(58) Field of Classification Search
CPC ...... B21D 37/04; B21D 37/10; B21D 37/205; B23P 15/24; B23Q 3/15513; B23Q 2003/155404; B23Q 3/15573
See application file for complete search history.

(56) References Cited

U.S. PATENT DOCUMENTS

| | | | | |
|---|---|---|---|---|
| 5,461,893 A | * | 10/1995 | Tyler | B21D 5/042 |
| | | | | 72/10.1 |
| 5,463,890 A | * | 11/1995 | Tachibana | B21D 7/02 |
| | | | | 72/294 |
| 5,771,725 A | * | 6/1998 | Mizukawa | B21D 5/045 |
| | | | | 72/17.3 |
| 6,145,359 A | | 11/2000 | Park | |
| 6,367,302 B1 | * | 4/2002 | Park | B21D 11/10 |
| | | | | 72/294 |
| 7,082,804 B2 | * | 8/2006 | Scott | B23P 15/406 |
| | | | | 72/307 |
| 7,882,720 B2 | * | 2/2011 | Mizukawa | B21D 37/205 |
| | | | | 72/307 |
| 8,511,135 B2 | * | 8/2013 | Kuwayama | B21D 7/165 |
| | | | | 72/422 |
| 2006/0230805 A1 | | 10/2006 | Scott et al. | |
| 2011/0211938 A1 | * | 9/2011 | Eakins | B25J 15/0019 |
| | | | | 414/738 |

\* cited by examiner

SYSTEMS, APPARATUS AND METHODS FOR FORMING METAL STRIPS INTO DIES

CROSS-REFERENCE

This application claims the benefit of U.S. Provisional Patent Application No. 62/723,783, filed on Aug. 28, 2018 entitled "Systems and Methods for Forming Metal Strips into Dies". The complete disclosure of U.S. Provisional Patent Application No. 62/723,783 is incorporated herein by reference.

TECHNICAL FIELD

The embodiments disclosed herein relate to systems, apparatus and methods for forming dies, and more specifically to systems, apparatus and methods for forming dies from metal strips.

BACKGROUND

A die is a specialized tool used in manufacturing industries to cut or shape material using a press. The shape of a die is generally customized to the item that it is used to create.

Dies are traditionally made from metal strips (e.g. steel strips). These metal strips are typically sharpened on one edge to form a cutting edge and then bent to form intricate shapes. After a die is formed, the die may be attached to a backing that permits pressure to be applied by a press or powered stamping machine to cut out a material when the material is placed on top of the cutting edge. In another example, once the die is formed it can be braced for self-support. These dies (i.e. leather dies) may then be manually placed on top of a hide before being places into a press for cutting.

Bending of the steel strips can be done by hand or by machine. Regardless of the method of manufacture, making the bends requires the skill of experienced artisans. Notches and other features may also be included in the dies to provide for intricate shapes when cutting is performed and to assist in alignment prior to stitching the cut pieces onto an end product.

Automation of the bending process by automatic bending machines has been an especially difficult problem for designers. Difficulties arise in part due to a high variability of steel rule metallurgic properties and in part due to the specialization of different tools to perform different functions in the die making process. Such a bending machine would have to be programmed to understand the final intricate shape of the dies, be provided with the various tools required to form a die having the desired shape and know precisely to which and when to change each of tools for forming each of the features in the desired shape and how to exploit each tool for the desired outcome.

Thus, there is a need for systems, apparatus and methods for automatically forming dies that have intricate shapes and features from metal strips.

SUMMARY

According to some embodiments, a system for forming a metal strip into a die having a predetermined shape through a series of forming operations is described herein. The system includes a base configured to support the metal strip as the metal strip undergoes the series of forming operations; a feeding device coupled to the base and configured to advance or retract the metal strip between each forming operation of the series of forming operations and grip the metal strip during each forming operation; a bending device coupled to the base adjacent to the feeding device, the bending device configured to bend a portion of the metal strip extending from the feeding device as one of the series of forming operations; a forming head coupled to the base, the forming head configured to house a pair of forming tools and provide features to the portion of the metal strip extending from the feeding device as one of the series of forming operations using the one or more forming tools; a robotic arm coupled to the base, the robotic arm configured to selectively provide the one or more forming tools to the forming head; and a computing unit in communication with the robotic arm, the computing unit configured to transmit a control signal to cause the robotic arm to retrieve the pair of forming tools and provide the pair of forming tools to the forming head.

According to some embodiments, the forming head is movable vertically relative to the base to provide the features to the portion of the metal strip extending from the feeding device.

According to some embodiments, the forming head is configured to apply a lateral force to each of the one or more forming tools to provide a feature to the portion of the metal strip.

According to some embodiments, the lateral force is configured based on a type of the metal strip.

According to some embodiments, the lateral force is configured based on the forming operation.

According to some embodiments, the robotic arm is configured to retrieve the pair of forming tools from a plurality of forming tools and provide the pair of forming tools to the forming head.

According to some embodiments, the pair of forming tools are housed in a pallet.

According to some embodiments, the feeding device grips the metal strip in more than one location.

According to some embodiments, the system also includes a heating element configured to selectively heat the portion of the metal strip extending from the feeding device.

According to some embodiments, the system also includes a cooling mechanism configured to selectively cool the portion of the metal strip extending from the feeding device.

According to some embodiments, the system also includes a sensor system configured to detect a temperature of a target portion of the metal strip and provide temperature information to a temperature computing unit.

According to some embodiments, the system also includes a temperature controller configured to provide variable temperature control by adjusting the heating element and/or the cooling mechanism in response to the temperature information.

These and other features and advantages of the present application will become apparent from the following detailed description taken together with the accompanying drawings. However, it should be understood that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

The skilled person in the art will understand that the drawings, further described below, are for illustration purposes only. The drawings are not intended to limit the scope of the applicant's teachings in any way. Also, it will be appreciated that for simplicity and clarity of illustration, elements shown in the figures have not necessarily been drawn to scale. For example, the dimensions of some of the elements may be exaggerated relative to other elements for clarity. Further aspects and features of the example embodiments described herein will appear from the following description taken together with the accompanying drawings.

DETAILED DESCRIPTION

Various apparatuses and methods are described below to provide an example of at least one embodiment of the claimed subject matter. No embodiment described below limits any claimed subject matter and any claimed subject matter may cover apparatuses and methods that differ from those described below. The claimed subject matter are not limited to apparatuses and methods having all of the features of any one apparatus and method described below or to features common to multiple or all of the apparatuses and methods described below. Subject matter that may be claimed may reside in any combination or sub-combination of the elements or process steps disclosed in any part of this document including its claims and figures. Accordingly, it will be appreciated by a person skilled in the art that an apparatus or method disclosed in accordance with the teachings herein may embody any one or more of the features contained herein and that the features may be used in any particular combination or sub-combination that is physically feasible and realizable for its intended purpose.

Furthermore, it is possible that an apparatus or method described below is not an embodiment of any claimed subject matter. Any subject matter that is disclosed in an apparatus or method described herein that is not claimed in this document may be the subject matter of another protective instrument, for example, a continuing patent application, and the applicant(s), inventor(s) and/or owner(s) do not intend to abandon, disclaim, or dedicate to the public any such invention by its disclosure in this document.

It will also be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures, and components have not been described in detail so as not to obscure the example embodiments described herein. Also, the description is not to be considered as limiting the scope of the example embodiments described herein.

It should be noted that terms of degree such as "substantially", "about" and "approximately" as used herein mean a reasonable amount of deviation of the modified term such that the result is not significantly changed. These terms of degree should be construed as including a deviation of the modified term, such as 1%, 2%, 5%, or 10%, for example, if this deviation would not negate the meaning of the term it modifies.

Furthermore, the recitation of any numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about" which means a variation up to a certain amount of the number to which reference is being made, such as 1%, 2%, 5%, or 10%, for example, if the end result is not significantly changed.

It should also be noted that, as used herein, the wording "and/or" is intended to represent an inclusive—or. That is, "X and/or Y" is intended to mean X or Y or both, for example. As a further example, "X, Y, and/or Z" is intended to mean X or Y or Z or any combination thereof.

In spite of the technologies that have been developed, there remains a need in the field for systems, apparatus and methods for automatically forming dies that have intricate shapes and features from metal strips.

Generally, an apparatus for forming dies is described herein. The apparatus can be used to form a wide variety of dies that have intricate shapes and features. The apparatus includes a robotic arm for selectively inserting forming tools into a forming head of the apparatus for adding features such as but not limited to full body notches, top nicks and grooves to dies. The forming tools for use with the apparatuses described herein generally have a mating end that conforms with a gripping portion of the robotic arm.

Figure 1:
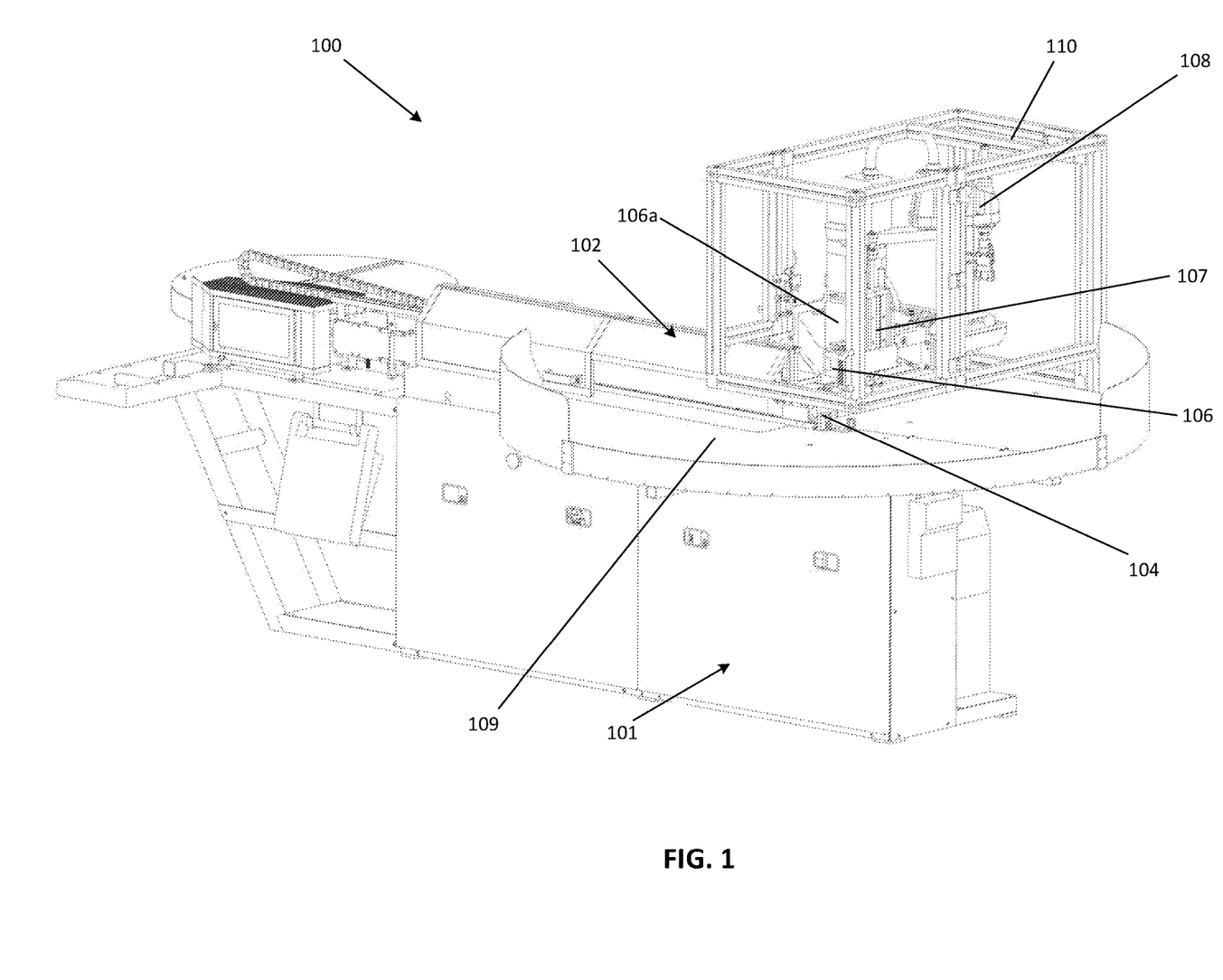
FIG. 1 is a front perspective view of an automated bending apparatus, according to one embodiment.
Figure 2:
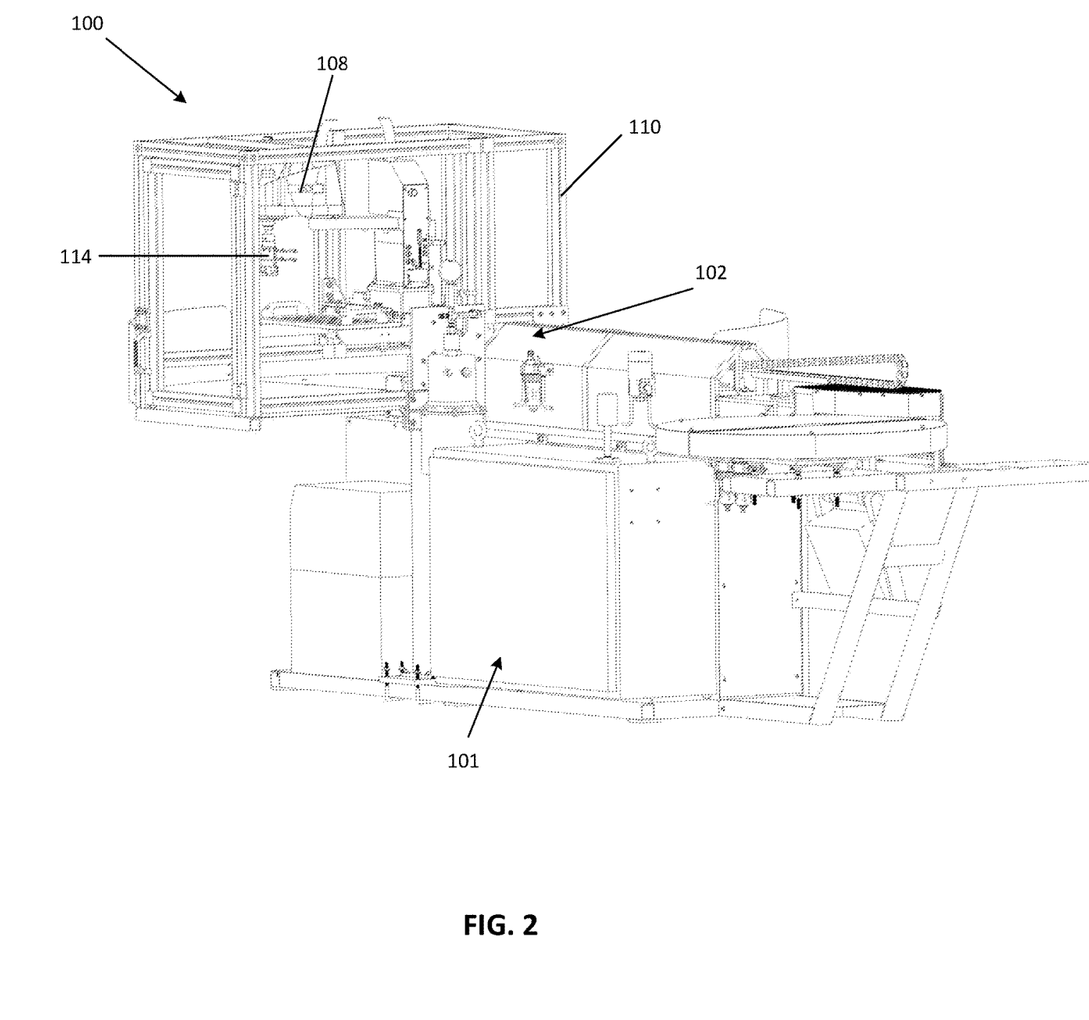
FIG. 2 is a rear perspective view of the automated bending apparatus of FIG. 1, according to one embodiment.
Figure 3:
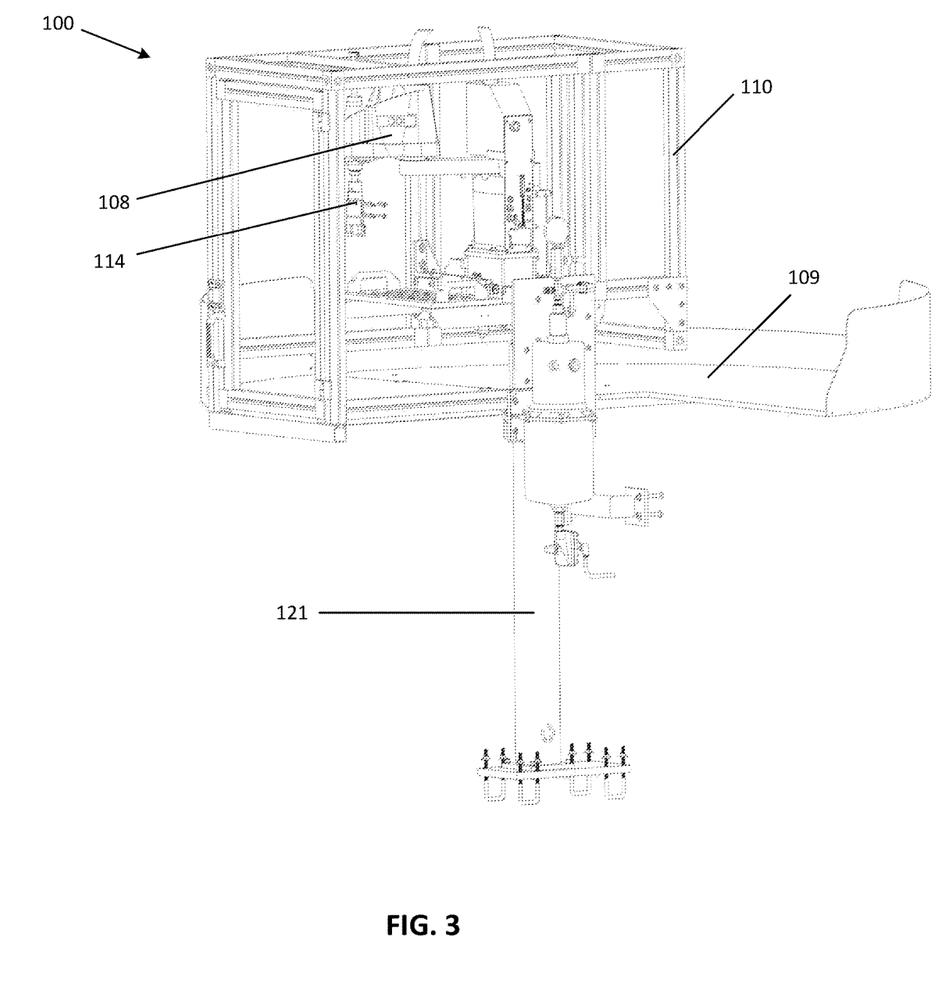
FIG. 3 is a rear perspective view of a portion of the automated bending apparatus of FIG. 1.

Referring now to FIGS. 1 to 3, illustrated therein is one embodiment of an apparatus 100 for forming dies from metal strips.

System 100 includes a base 101, a feeding device 102 for providing the metal strip for bending and cutting, a bending device 104 for performing bending operations on the metal strip to form a die having a preselected shape, a forming head 106 supported above the base 101 for adding features (e.g. full body notches, top nicks grooves, etc.) to the metal strip, and a vertical motion apparatus 107 for moving the forming head 106 axially with respect to the base 101 for the forming head 106 to add features to the metal strip.

Base 101 can be any appropriate base for supporting the feeding device 102, the bending device 104 and/or the metal strip. Base 101 is generally stationary and positioned below the forming head 106, the feeding device 102 and the bending device 104 (as described below). Base 101 can generally withstand vertical forces applied by the forming head 106 and/or vertical motion apparatus 107 while the forming head 106 is performing forming operations on the metal strip.

In the embodiments shown in the figures, base 101 has a table 109. Table 109 may have, for example, a circular top surface. Base 101 may be configured to house electronic equipment associated with the system 100. After a forming operation has be performed on the metal strip and the metal strip is advanced by the feeding device 102 (as described below), table 109 generally supports the portion of the metal strip that has undergone the forming operation. Accordingly, table 109 of base 101 is generally sized and shaped to support the die once the die has been formed by the system 100.

As noted above, feeding device 102 is supported on the base 101. Feeding device 102 advances at least a portion of the metal strip towards the bending device 104 and the forming head 106 for the bending device 104 and the forming head 106 to perform forming operations (e.g. bending operations, punch operations, stamping operations, adding notches, adding markings, etc.) to the metal strip to form a die. Feeding device 102 is configured to advance or retract the metal strip towards the bending device 104 and the forming head 106 between each forming operation of a series of forming operations that are performed on the metal strip to form the die. Further, feeding device 102 may include a gripping portion (not shown) to grip the metal strip to support the metal strip (i.e. to restrict movement of the metal strip) as the bending device 104 and/or the forming head 106 performing forming operations on the metal strip.

In some embodiments, feeding device 102 includes more than one gripping portion for gripping the metal strip. For example, in some embodiments feeding device 102 includes more than one (e.g. two) gripping components (not shown) for gripping at least a portion of the metal strip. The gripping components may be positioned towards a rear end of the feeding device 102 (e.g. spaced from the bending device 104) or may be positioned towards a front end (e.g. adjacent to the bending device 104). In some embodiments, two gripping components may provide for the user and the computer modules to maintain at least one anchor point with a known location. Having at least one anchor point active at any given moment with encoder values may ensure accurate advancement and retraction of the metal strip. Further, encoder values from the gripping components may be used to accurately index the metal strip.

After advancing at least a portion of the metal strip towards the bending device 104 and the forming head 106, at least a portion of the metal strip extends from the feeding device and can be acted upon by the bending device 104 and/or the forming head 106 to perform the forming operations on the metal strip.

Bending device 104 is configured to perform bending operations on a portion of the metal strip to form the die having a preselected shape when the portion of the metal strip protrudes (e.g. extends) from the feeding device 102. In the embodiments shown in the figures, bending device 104 is positioned forward of the feeding device 102 such that feeding device 102 advances the metal strip forwardly towards a front end of the system 100 for the bending device 104 to perform bending operations on the metal strip.

In the embodiments shown in the figures, the bending device 104 is shown as having an outer body having a cylindrical shape and an opening for the metal strip to pass through (see for example FIG. 1). A movable bending portion driven by an actuator (not shown) is housed inside of the body of the bending device base 101. When the actuator is energized, it forces the movable bending portion to rotate about an axis perpendicular to the table 109 of the base 101 to impart a force on either side of the metal strip to bend the metal strip. The degree of rotation of the movable bending portion can be controlled to yield the desired angle of the metal strip. The movable bending portion can be any suitable shape but preferably applies a force evenly across a height of the metal strip to evenly bend the metal strip taking into account the unique steel strip edge geometry. Bending device 104 can also be used to cut the metal strip to a preferred length by fatiguing the steel rule at the bend point. Cutting to length is generally the final operation to be performed during formation of a die.

Figure 4:
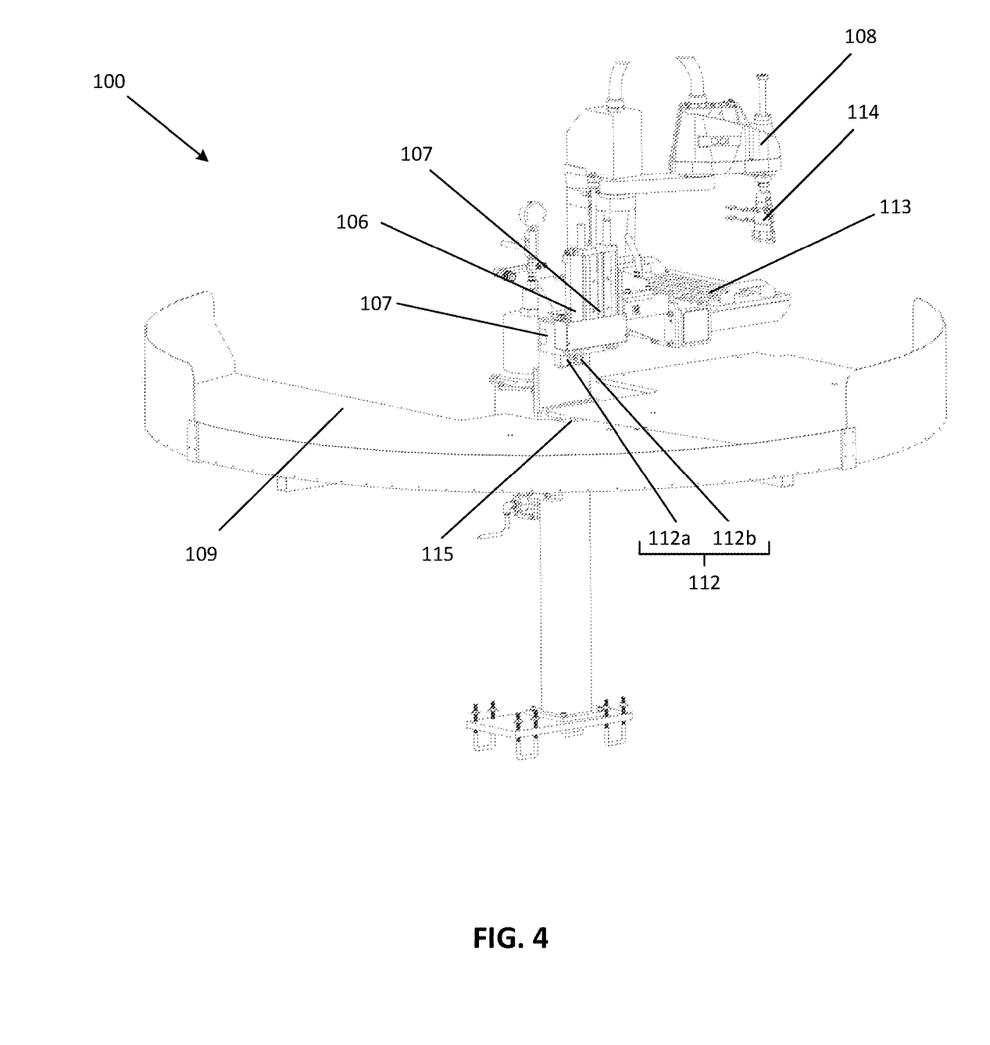
FIG. 4 is a front perspective view of a portion of the automated bending apparatus of FIG. 1.

Forming head 106 operates to form notches and/or other features in the strip. Referring now to FIG. 4, illustrated therein is a perspective view of forming head 106 of the apparatus 100, according to one embodiment. The forming head 106 has a housing 106a that defines a chamber (e.g. a pallet) therein for housing the forming tools 112 for forming notches and/or other shapes in the metal strip.

The housing 106a may be made of any material having sufficient strength to withstand the forces applied by the robotic arm 108 and to withstand forces exerted by the base 101 when the forming head moves downwardly relative to the base 101 to form notches and/or other shapes in the metal strip.

For example, in some embodiments, forming head 106 can be used to provide notches in the metal strip. Notches can be marked on the metal strip at selected locations or can be formed on the metal strip at selected locations prior to bending. The metal strip must first be moved forward or backward (e.g. by the feeding device 102) to position the desired end point of the metal strip at the forming head 106.

Forming head 106 is configured to position forming tools 112a, 112b on both sides of the metal strip for providing notches and other features to the metal strip. Forming tools 112a, 112b are further described below. Forming head 106 is configured to move vertically with respect to the table 109 of the base 101, to provide features to the metal strip, via vertical motion apparatus 107. Generally, once the forming head 106 has been loaded with the forming tools 112 (as described below), the forming head 106 is lowered to contact the top surface of the table 109 to substantially surround a selected portion of the metal strip (i.e. the portion of the metal strip to receive the feature). Once the forming tools 112a and 112b are positioned on opposite sides of the metal strip, a lateral force is applied to the tool connected to the hydraulic piston, in this embodiment, 112b, resulting in motion of the forming tools 112 towards the opposed sides of the metal strip. In some embodiments, the forming head 106 can apply up to about 35,000 lbf at 5000 psi for forming features in the metal strip. In some other embodiments, the forming head 106 can apply about 21,000 lbf at 3000 psi for forming features in the metal strip.

The metal strip conforms to the shapes of at least a portion of the forming tools 112a, 112b (as described below) when the forming tools 112a, 112b are pressed against the opposed sides of the metal strip. In some embodiments, a forming pressure and motion profile of the forming tools 112 can be controlled based on the feature that is being provided to the metal strip by the forming head. For instance, in one example, a speed that the forming head 106 laterally moves the forming tools 112a and 112b towards the metal strip to form features in the metal strip can be varied based on different features that are provided to the metal strip. In some embodiments, selected portions of the metal strip can be double formed. Herein, double forming occurs when more than one forming operation is performed on a selected portion of the metal strip. For instance, two identical consecutive forming operations can be performed on a selected portion of the metal strip in series and each forming operation may be performed using a different motion profile. In some embodiments, the end pressure/end force of the forming tools 112a, 112b can be varied based on the forming operation performed, resulting in a varied forming profile.

Figure 5:
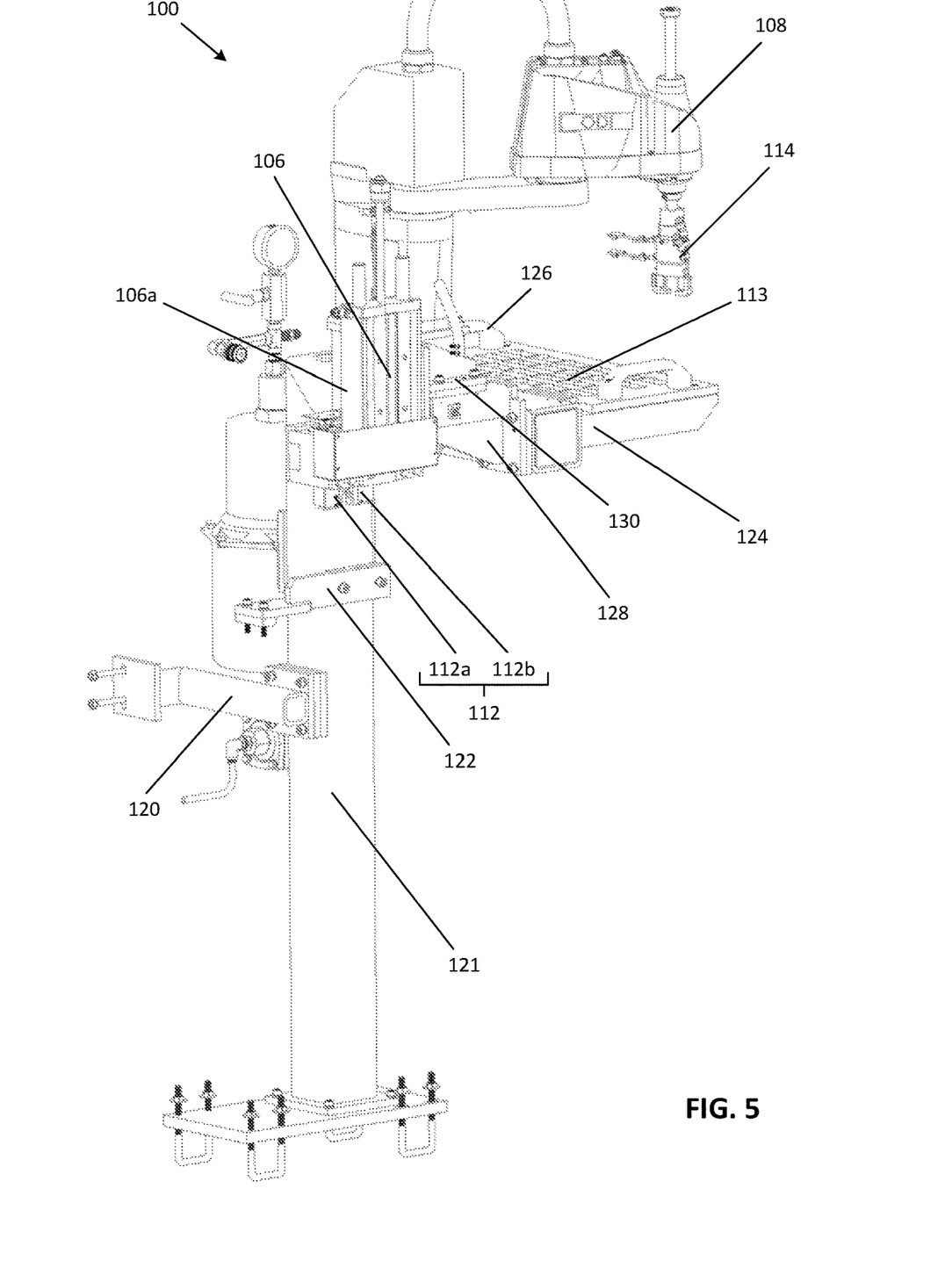
FIG. 5 is a front perspective view of a portion of the automated bending apparatus of FIG. 1.
Figures 6A, 6B:
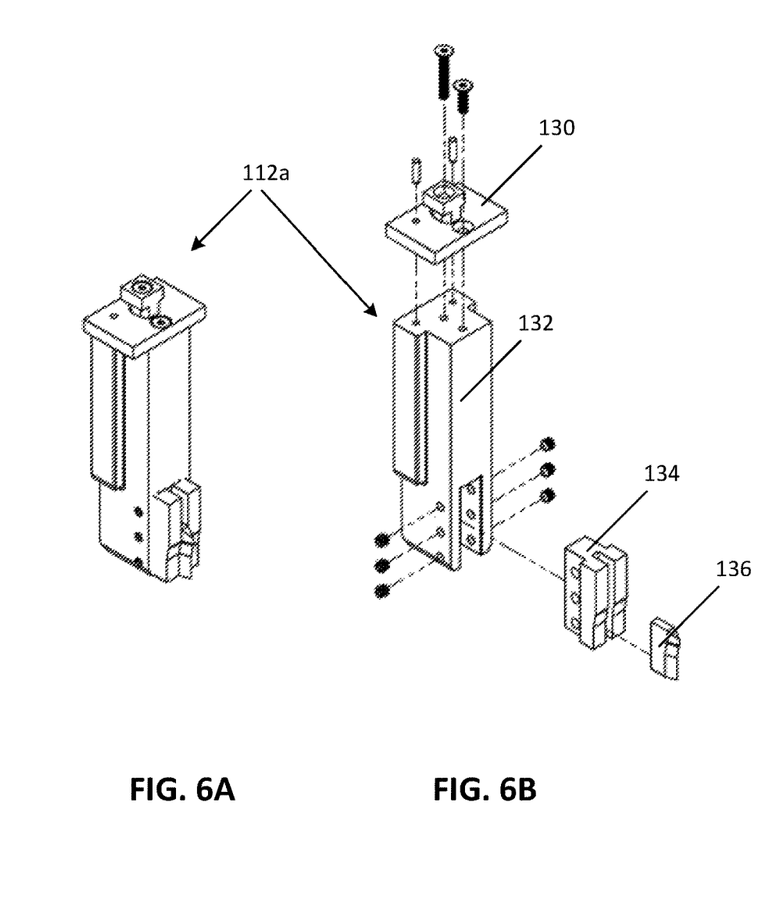
FIG. 6A is a perspective view of a male forming tool, according to one embodiment.
FIG. 6B is an exploded perspective view of the male forming tool of FIG. 6A.
Figure 6C:
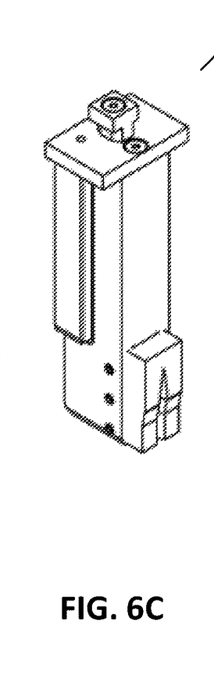
FIG. 6C is a perspective view of a female forming tool, according to one embodiment.
Figure 6D:
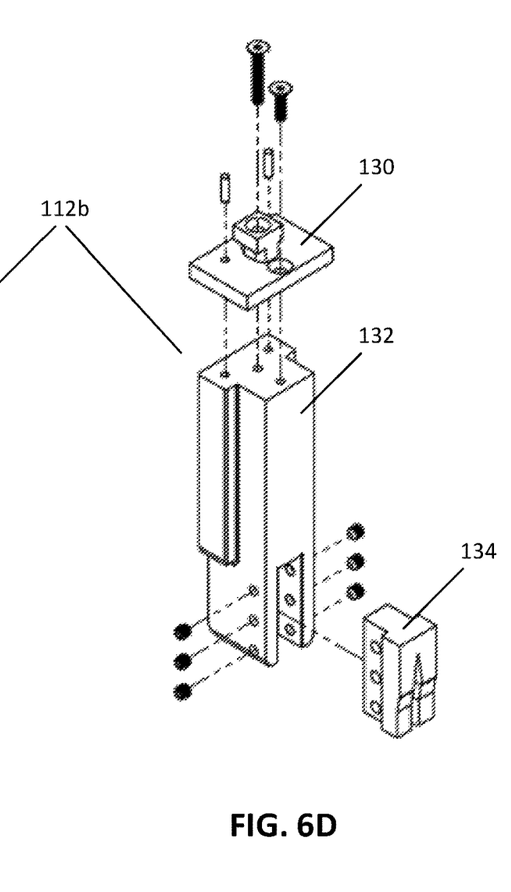
FIG. 6D is an exploded perspective view of the female forming tool of FIG. 6C.

Forming head 106 may be supported by a spine 121 coupled to the base 101 and/or table 109. Referring now to FIG. 5, shown therein is a perspective view of a portion of the automated bending apparatus 100 of FIG. 1. Spine 121 is shown has having a first spine support 120 for coupling the spine to a side wall of the base 101 and a second spine support 122 for coupling the spine 121 to the table 109. First spine support 120 and second spine support 122 may have any configuration to provide for coupling the spine to a sidewall of the base 101 and the table 109, respectively. In some embodiments, the spine 121 may be coupled to the base 101, for example, using a shim plate and two u bolts.

FIG. 5 also shows a first pallet shelf 124, a second pallet shelf 126, a first cylinder support bracket 128 and a second cylinder support bracket 130.

System 100 also includes a robotic arm 108. Again, referring to FIGS. 4 and 5, a perspective view of one embodiment of a robotic arm 108 is shown therein. Robotic arm 108 can be any robotic arm capable of providing at least four degrees of motion. Robotic arm 108 generally retrieves the forming tools 112a, 112b for performing forming operations on the metal strip, and provides the forming tools 112a, 112b to the forming head 106. In some embodiments, robotic arm 108 retrieves the forming tools 112a, 112b for performing forming operations on the metal strip from a pallet 113. Robotic arm 108 also collects the forming tools 112a, 112b from the forming head 106 and returns the forming tools 112a, 112b to the pallet 113. In some embodiments, the robotic arm 108 provides a single forming tool (e.g. forming tool 112a) to the forming head 106 and collects a single forming tool (e.g. forming tool 112a) from the forming head 106. In other embodiments, the robotic arm 108 provides a pair of forming tools (e.g. forming tools 112a and 112b) to the forming head 106 and collects a pair of forming tools (e.g. forming tools 112a and 112b) from the forming head 106. Factors that may contribute to how many forming tools the forming head can provide/collect include but are not limited to the configuration of gripping portion 114 (described below) and maximum loading of robot arm 108.

Generally, a gripping portion 114 of the robotic arm 108 (see FIGS. 4 and 5) is shaped to correspond to a top portion of the forming tools 112a, 112b (see FIGS. 6A-6D). In this manner, gripping portion 114 can secure the forming tools 112a, 112b, lift the forming tools 112 from the pallet 113, carry the forming tools 112a, 112b to the forming head 106 and insert the forming tools into a chamber of the forming head 106.

In the embodiment shown in the figures, robotic arm 108 is a Selective Compliance Assembly Robot Arm (SCARA) purchased from Epson (Model T3). Again, it should be noted that robotic arm 108 can be any robotic arm capable of providing motion in at least four degrees of freedom.

In some embodiments, a shield 110 may be placed substantially around the robotic arm 108. Shield 110 may protect the robotic arm from colliding with external objects (e.g. users) and may protect external objects from impact by the robotic arm 108.

It should be noted that there are one or more computing units that are used in the system 100 including a computing unit for the robotic arm 108, a computing unit a computing unit for feeding device 102, and one or more computing units for the forming head 106. These computing units can be implemented using micro-controllers, processors, video graphics chips, Application Specific Integrated Circuits or other hardware that can provide sufficient processing power for the particular tasks that are to be implemented.

In some embodiments, the forming head 106 and the feeding device 102 can be executed using the same computing unit (e.g. a computer) at the same time using the same processor (a microprocessor). Alternatively, in some embodiments the forming head 106 and the feeding device 102 can be executed on dedicated processors (e.g. different microprocessor) or even on separate processing units (e.g. different computers) depending on the required computational complexity of device.

Generally, one or more of the computing units instructs the robotic arm 108 on which of the forming tools is required to perform the current forming operation in the series of forming operations. Robotic arm 108 responds by retrieving the desired forming tool from the pallet 113, for example, and provides the forming tool to the forming head 106 for performing the current forming operation on the metal strip.

It should be noted, as described below, that the selected portion of the metal strip to receive the feature may undergo a temperature change prior to or following impact by the forming tools 112a, 112b. System 100 may therefore include a temperature sensor (not shown), a heating element 115 and a cooling mechanism (not shown), In some embodiments, a desired forming operation may require the metal strip to be heated prior to undergoing a forming operation to provide the metal strip with the desired feature. For example, when heating the metal strip is required, heating element 115 can heat a selected portion of the metal strip that has been advanced from the feeding device 102. In the embodiments shown in the figures, heating element 115 (see FIG. 4) is positioned below the table 109 of the base 101 and is movable vertically with respect to the table 109. For instance, heating element 115 may move vertically from below the top surface of the table 109 to extend through the table 109 and directly heat the selected portion of the metal strip. Heating element 115 may be configured to heat one side of the metal strip or may be configured to heat opposed sides of the metal strip.

System 100 may also include a cooling mechanism (not shown). In some embodiments, the cooling mechanism may be a pressure air nozzle that can be remotely controlled to direct air onto the metal strip to cool the metal strip. Cooling of the metal strip generally occurs after a forming operation has been performed.

System 100 may also include a temperature sensor and a computing unit (not shown). In some embodiments, the temperature sensor may measure a temperature of the metal strip and the computing unit may be configured to turn on or off either or both of the heating element 115 and/or the cooling mechanism in response to the temperature measured by the temperature sensor (e.g. bang-bang control). For example, the computing unit may be configured to automatically turn off the heating element 115 when the temperature of the metal strip reaches a critical value. The critical value can be configured/selected by a user using the computing unit or automatically determined by software based on material properties or feature type. In other embodiments, the temperature sensor may measure a temperature of the metal strip and the computing unit may be configured to provide variable temperature control to metal strip by controlling the heating element 115 and/or the cooling mechanism in response to the temperature measured by the temperature sensor. For instance, the computing unit may be configured to control the intensity of heat (i.e. variable heating power) of the heating element 115 and/or the air pressure (i.e. variable cooling intensity) of the cooling mechanism. The intensity of heat could be a function of a difference between a target temperature and a measured temperature (e.g. PID controller).

It should be noted that in some embodiments, successive forming operations can be performed on a selected portion of the metal strip without moving the metal strip. In these cases, heating and/or cooling can be performed before or after each forming operation without the feeding device 102 advancing the metal strip.

Referring now to FIGS. 6A-6D, exemplary embodiments of a male forming tool 112a (e.g. a punch) and a female forming tool 112b (e.g. a forming block), together complementary forming tools 112, can be carried by the forming head 106 and used to provide features to the metal strip. For instance, in some embodiments, the complementary forming tools 112 can be housed in one or more chambers of the forming head 106 that are configured to expose at least a portion of the forming tools (see forming head 112 exposed below forming tool 106 in FIG. 4) to the metal strip.

Male forming tool 112a and female forming tool 112b include a body 132, a mating end 130 coupled to a top portion of the body 132, and a block 134 coupled to a bottom portion of the body 132. Male forming tool 112a also include a punch 136 coupled to the block 134 for forming features in the metal strip. Block 134 and block 136 can be customized for forming different features in the metal strip.

As noted above, the mating end 130 of the forming tools 112a and 112b is generally sized and shaped to conform to a gripping portion of the robotic arm 108 for the robotic arm 108 to retrieve the forming tools 112a, 112b and provide them to the forming head 106 and, subsequently, retrieve the forming tools 112a, 112b from the forming head 106 following use in a forming operation.

While the applicant's teachings described herein are in conjunction with various embodiments for illustrative purposes, it is not intended that the applicant's teachings be limited to such embodiments as the embodiments described herein are intended to be examples. On the contrary, the applicant's teachings described and illustrated herein encompass various alternatives, modifications, and equivalents, without departing from the embodiments described herein, the general scope of which is defined in the appended claims.

What is claimed is:

1. A system for forming a metal strip into a die having a predetermined shape through a series of forming operations, the system comprising:
   a base configured to support the metal strip as the metal strip undergoes the series of forming operations;
   a feeding device coupled to the base and configured to advance the metal strip between each forming operation of the series of forming operations and grip the metal strip during each forming operation;
   a bending device coupled to the base adjacent to the feeding device, the bending device configured to bend a portion of the metal strip extending from the feeding device as one of the series of forming operations;
   a forming head coupled to the base and movable between a first position and a second position, the forming head being configured to receive one or more forming tools in a cavity thereof at the first position and provide features to the portion of the metal strip extending from the feeding device as one of the series of forming operations using the one or more forming tools at the second position;
   a robotic arm coupled to the base, the robotic arm configured to selectively provide the one or more forming tools to the forming head; and
   a computing unit in communication with the robotic arm, the computing unit configured to transmit a control signal to cause the robotic arm to retrieve the one or more forming tools and provide the one or more forming tools to the forming head.

2. The system of claim 1, wherein the forming head is movable vertically relative to the base between the first position and the second position to provide the features to the portion of the metal strip extending from the feeding device when at the second position.

3. The system of claim 1, wherein the forming head is configured to apply a lateral force to each of the one or more forming tools to provide a feature to the portion of the metal strip when at the second position.

4. The system of claim 3, wherein the lateral force is configured based on a type of the metal strip.

5. The system of claim 3, wherein the lateral force is configured based on the forming operation.

6. The system of claim 1, wherein the robotic arm is configured to retrieve the one or more forming tools from a plurality of forming tools and provide the one or more forming tools to the forming head.

7. The system of claim 1, wherein the one or more forming tools are housed in a pallet.

8. The system of claim 1, wherein the feeding device grips the metal strip in more than one location.

9. The system of claim 1, further comprising a heating element configured to selectively heat the portion of the metal strip extending from the feeding device.

10. The system of claim 1, further comprising a cooling mechanism configured to selectively cool the portion of the metal strip extending from the feeding device.

11. The system of claim 9, further comprising a sensor system configured to detect a temperature of a target portion of the metal strip and provide temperature information to a temperature computing unit.

12. The system of claim 9, further comprising a temperature controller configured to provide variable temperature control of the metal strip by adjusting the heating element and/or the cooling mechanism in response to the temperature information.

13. The system of claim 9, wherein the heating element is positioned below the base and is movable vertically with respect to the base.

14. The system of claim 13, wherein the heating element is movable vertically from below a top surface of the base through the base to directly heat the portion of the metal strip.

15. The system of claim 1, wherein the robotic arm comprises a gripping portion, the gripping portion being shaped to correspond to a top portion of the one or more forming tools to secure the one or more forming tools and provide the one or more forming tools to the forming head.

* * * * *